United States Patent [19]
Weeks et al.

[11] Patent Number: 5,704,813
[45] Date of Patent: Jan. 6, 1998

[54] PROXIMITY SENSOR HOUSING AND ARRANGEMENT

[75] Inventors: Robert W. Weeks, Lyndhurst; Jon Slaybaugh, Concord, both of Ohio

[73] Assignee: Namco Controls Corporation, Highland Heights, Ohio

[21] Appl. No.: 571,808

[22] Filed: Dec. 13, 1995

[51] Int. Cl.[6] .................................... H01R 13/04
[52] U.S. Cl. ........................ 439/694; 439/540.1
[58] Field of Search ................... 439/449, 453–455, 439/456, 420, 660, 692, 694, 540.1; 200/82 R, 82 E; 340/626, 686

[56] References Cited

U.S. PATENT DOCUMENTS

| | | | |
|---|---|---|---|
| 1,984,181 | 12/1934 | French | 439/694 |
| 3,975,075 | 8/1976 | Mason | 439/694 X |
| 4,086,456 | 4/1978 | Bone . | |
| 4,168,415 | 9/1979 | Edwards, Jr. et al. . | |
| 4,317,953 | 3/1982 | Brownell et al. | 439/470 X |
| 4,552,987 | 11/1985 | Stebegg et al. . | |
| 4,645,887 | 2/1987 | Whiting . | |
| 4,680,436 | 7/1987 | Brausfeld et al. . | |
| 4,752,657 | 6/1988 | Kane et al. . | |
| 4,755,636 | 7/1988 | Akio . | |
| 4,755,637 | 7/1988 | Turck . | |
| 4,785,240 | 11/1988 | Newell et al. . | |
| 4,799,048 | 1/1989 | Goshima et al. . | |
| 4,800,241 | 1/1989 | McNamara . | |
| 4,803,318 | 2/1989 | Lymburner . | |
| 4,806,915 | 2/1989 | Rasmussen . | |
| 4,876,531 | 10/1989 | Dondorf . | |
| 4,911,652 | 3/1990 | Savoca et al. | 439/650 X |
| 4,912,291 | 3/1990 | Hepperle et al. . | |
| 4,914,388 | 4/1990 | Kalista et al. . | |
| 4,982,652 | 1/1991 | Blatt . | |
| 5,031,504 | 7/1991 | Gratzmuller . | |
| 5,035,647 | 7/1991 | Schafer | 439/135 X |
| 5,043,543 | 8/1991 | Weeks et al. . | |
| 5,196,792 | 3/1993 | Lafaye . | |

OTHER PUBLICATIONS

Namco® Electronic Sensors General Catalog 1994, pp. 62–63, 82–83, and 216–221 (1993).
Namco® LPR Cylindicator® Sensor Instructions, EE200–1/I, 2 pages (1990).

Primary Examiner—Khiem Nguyen
Attorney, Agent, or Firm—Watts, Hoffman, Fisher & Heinke, Co., L.P.A.

[57] ABSTRACT

A proximity sensor assembly is molded with a connector support that extends from an outer side of a sensor housing and supports an electrical connector such that an axis of the electrical connector intersects at a fixed angle less than approximately 90 degrees a line tangential to the outer side from which the molded connector support extends. The orientation of the connector support helps facilitate mounting of the proximity sensor assembly to an actuator housing such that the axis of the electrical connector intersects a center line of the actuator housing at a fixed angle less than approximately 90 degrees and greater than approximately zero degrees. In this manner, two proximity sensor assemblies may be mounted relatively closer to one another at opposite ends of the actuator housing while shielding conductor cables mounted to the proximity sensor assemblies in a corridor or region between the proximity sensor assemblies.

19 Claims, 5 Drawing Sheets

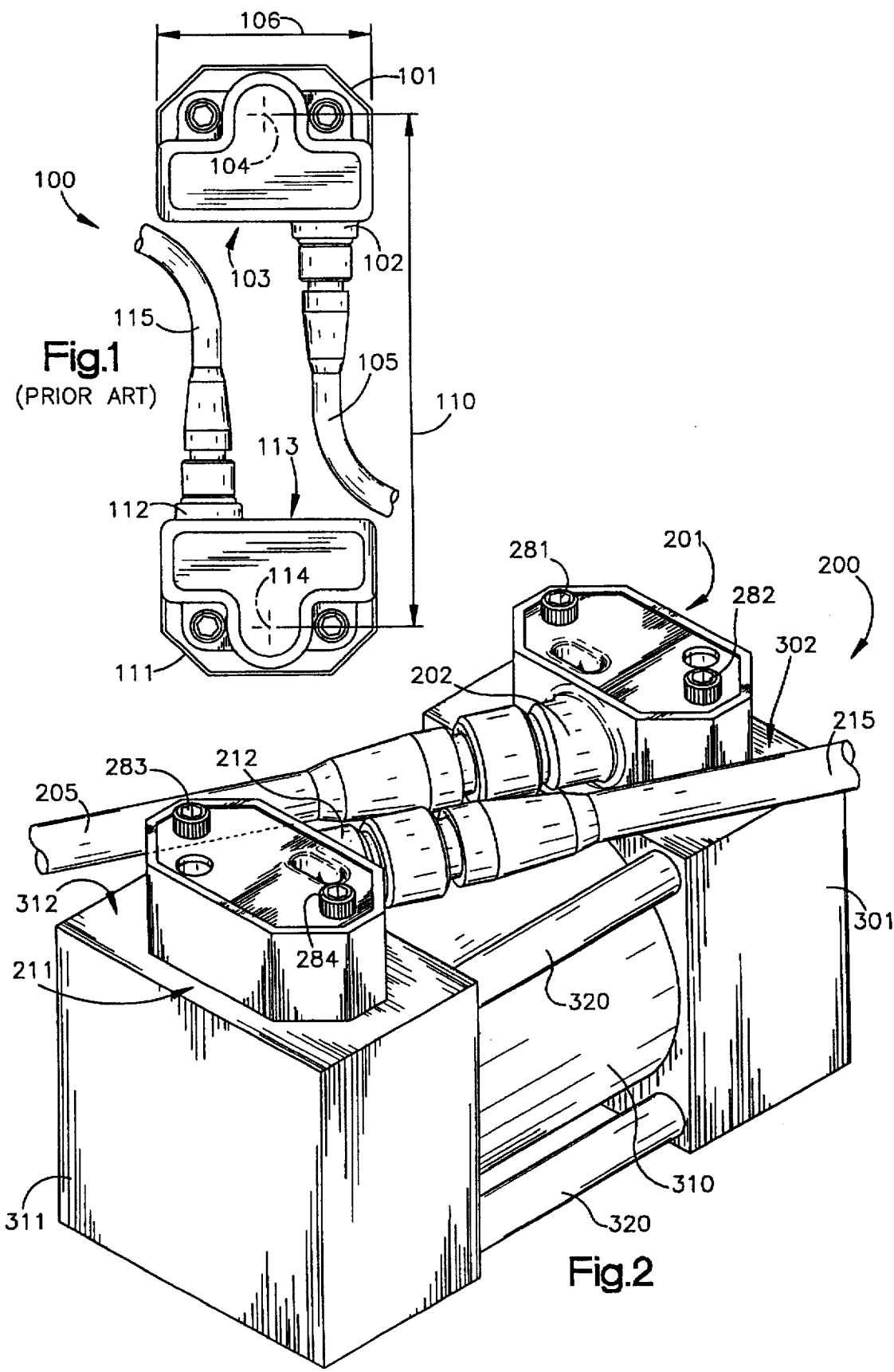

1

PROXIMITY SENSOR HOUSING AND ARRANGEMENT

FIELD OF THE INVENTION

The present invention relates generally to the field of proximity sensors. More particularly, the present invention relates to the field of housings and arrangements for proximity sensors.

BACKGROUND OF THE INVENTION

Namco® Electronic Sensors General Catalog 1994 at pages 62–63 and 82–83 disclose typical proximity sensors and their operation in sensing cylinder actuation. Pages 216–221 of this catalog disclose conductor cables for use with such proximity sensors. These catalog pages are herein incorporated by reference.

FIG. 1 illustrates a prior art proximity sensor arrangement 100 having a first proximity sensor assembly 101 and a second proximity sensor assembly 111. Proximity sensor assemblies 101 and 111 are Low Profile Cylindicator® Sensors disclosed on page 63 of the Namco® Electronic Sensors General Catalog 1994.

Proximity sensor assemblies 101 and 111 have a width 106 and are positioned relative to one another such that a probe position 104 of proximity sensor assembly 101 is at a distance 110 from a probe position 114 of proximity sensor assembly 111. Proximity sensor assemblies 101 and 111 may be mounted to monitor the position of an actuator piston as the piston moves within a cylinder housing along a linear path of travel between probe positions 104 and 114. Probe positions 104 and 114 indicate the location of a probe for sensing the relative position of the actuator piston for each proximity sensor assembly 101 and 111, respectively. Based on the sensed limits of actuator travel, proximity sensor assemblies 101 and 111 may be used to control a manufacturing process.

Proximity sensor assemblies 101 and 111 each include a cylindrical connector support 102 and 112, respectively, that extend from opposing sidewalls 103 and 113, respectively, for mounting electrical conductor cables 105 and 115 to proximity sensor assemblies 101 and 111, respectively. Connector supports 102 and 112 extend at a fixed angle of approximately 90 degrees relative to the generally planar surface of sidewalls 103 and 113, respectively.

Proximity sensor assemblies 101 and 111 are positioned with respect to one another such that opposing sidewalls 103 and 113 help define a shielded corridor or region for conductor cables 105 and 115 to help protect conductor cables 105 and 115 from damage. In positioning proximity sensor assemblies 101 and 111 in this manner, however, the width 106 of proximity sensor assemblies 101 and 111 and the orientation of connector supports 102 and 112 limit the minimum distance 110 between probe positions 104 and 114, as illustrated in FIG. 1. As the minimum distance 110 between probe positions 104 and 114 becomes limited, the length of the path of travel for the actuator piston monitored between probe positions 104 and 114 is likewise limited.

SUMMARY AND OBJECTS OF THE INVENTION

One object of the present invention is to provide for a proximity sensor assembly having an improved housing.

Another object of the present invention is to provide for a proximity sensor assembly that facilitates the positioning of proximity sensor assemblies in locations relatively closer to one another.

Another object of the present invention is to provide for a proximity sensor arrangement having proximity sensor assemblies positioned in locations relatively closer to one another.

Another object of the present invention is to provide for a proximity sensor arrangement having proximity sensor assemblies positioned in locations relatively closer to one another while shielding conductor cables mounted to the proximity sensor assemblies in a corridor or region between the proximity sensor assemblies.

One apparatus in accordance with the present invention includes a sensor housing defining an interior region and having a base and an outer side. The sensor housing is molded with a connector support that extends from the outer side of the sensor housing. A probe extends from the base of the sensor housing, and sensor circuitry is mounted in the interior region of the sensor housing and coupled to the probe.

An electrical connector is coupled to the sensor circuitry and supported by the molded connector support such that an axis of the electrical connector intersects at a fixed angle less than approximately 90 degrees a line tangential to the outer side from which the molded connector support extends. This fixed angle may be between approximately 35 degrees and approximately 80 degrees and more particularly may be between approximately 60 degrees and approximately 75 degrees.

A mounting assembly mounts the sensor housing to an actuator housing such that the probe is positioned in a predetermined location in relation to a moveable actuator in the actuator housing and such that the axis of the electrical connector intersects a center line of the actuator housing at a fixed angle less than approximately 90 degrees and greater than approximately zero degrees. This fixed angle may be between approximately 10 degrees and approximately 55 degrees and more particularly may be between approximately 15 degrees and approximately 30 degrees. The position of the actuator in the actuator housing is sensed by the sensor circuitry.

Another sensor housing may be mounted to the actuator housing such that the axis of the electrical connector for each sensor housing intersects the center line of the actuator housing at a fixed angle less than approximately 90 degrees and greater than approximately zero degrees. The axis of the electrical connector for each sensor housing may be parallel to one another.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 illustrates a top plan view of a prior art proximity sensor arrangement;

FIG. 2 illustrates a perspective view of a proximity sensor arrangement in accordance with the present invention;

DETAILED DESCRIPTION

The following detailed description sets forth an embodiment or embodiments in accordance with the present invention for proximity sensor housing and arrangement. In the following description, details are set forth such as specific configurations, dimensions, etc., in order to provide a thorough understanding of the present invention. It will be evident, however, that the present invention may be practiced without these details. In other instances, well-known applications, circuitry, operations, etc., have not been described in particular detail so as not to obscure the present invention.

Figure 3:
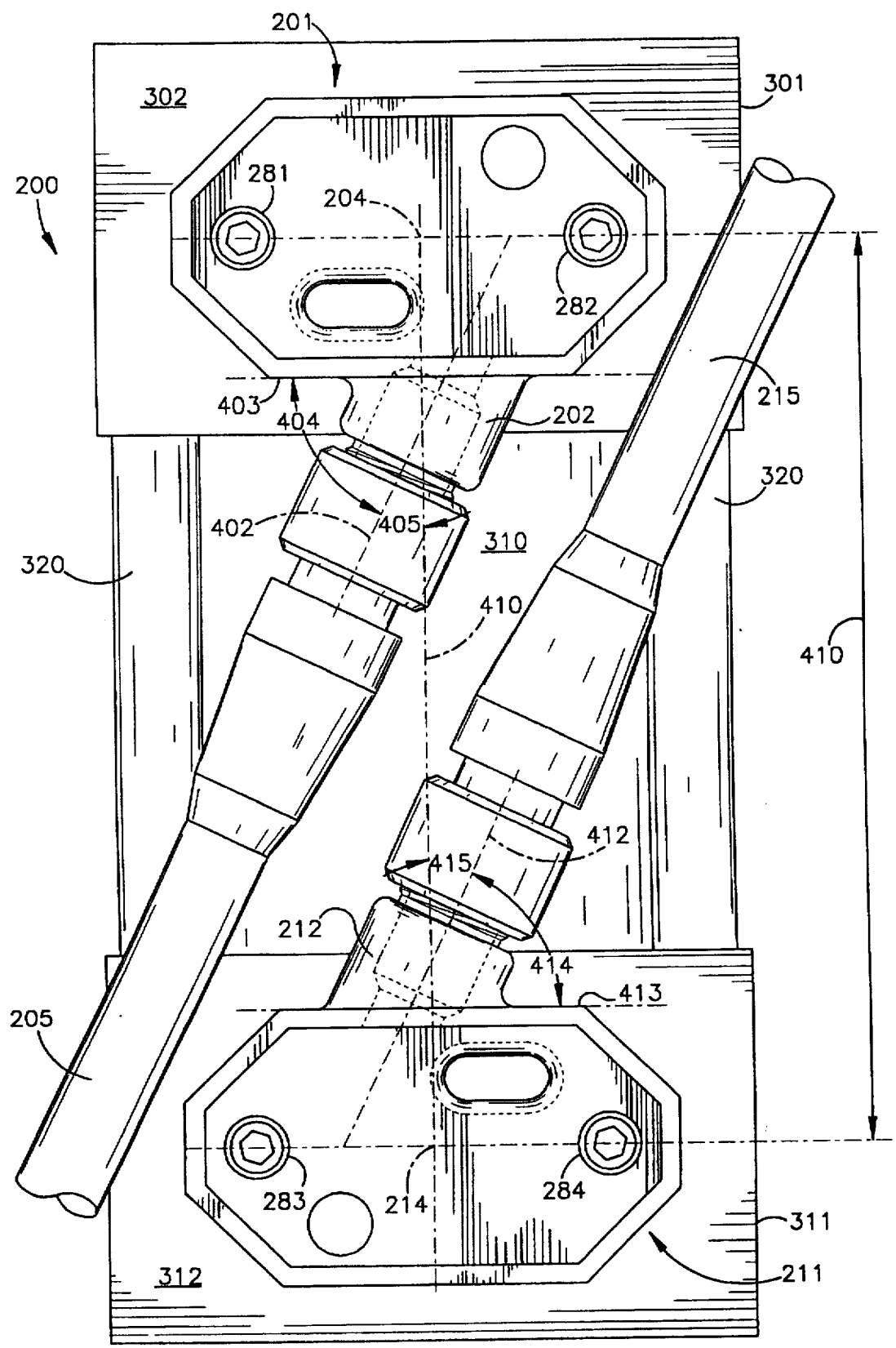
FIG. 3 illustrates a top plan view of the proximity sensor arrangement of FIG. 2.

FIGS. 2–3 illustrate for one embodiment a proximity sensor arrangement 200 having a first proximity sensor assembly 201 and a second proximity sensor assembly 211. Proximity sensor assemblies 201 and 211 may be used to monitor the position of an actuator piston mounted in a cylinder housing 310 of a hydraulic or pneumatic actuated cylinder.

Proximity sensor assemblies 201 and 211 each include a cylindrical connector support 202 and 212, respectively, for supporting an electrical connector for each proximity sensor assembly 201 and 211, respectively. As illustrated in FIG. 3, proximity sensor assembly 201 is configured to support the electrical connector with connector support 202 such that an axis 402 of the electrical connector intersects at a fixed angle 404 a line 403 that is tangential to the outer side from which connector support 202 extends. Proximity sensor assembly 211 is likewise configured to support the electrical connector with connector support 212 such that an axis 412 of the electrical connector intersects at a fixed angle 414 a line 413 that is tangential to the outer side from which connector support 212 extends.

Conductor supports 202 and 212 are also used to mount electrical conductor cables 205 and 215 to proximity sensor assemblies 201 and 211, respectively. Conductor cables 205 and 215 are electrically connected to the electrical connector supported with connector support 202 and 212, respectively. Conductor cables 205 and 215 route electrical signals to and from proximity sensor assemblies 201 and 211, respectively.

Proximity sensor assemblies 201 and 211 are positioned relative to one another such that a probe position 204 of proximity sensor assembly 201 is at a distance 410 from a probe position 214 of proximity sensor assembly 211. Probe positions 204 and 214 indicate the location of a probe for sensing the position of the actuator in relation to the probe as the actuator moves in cylinder housing 310 along a linear path of travel between probe positions 204 and 214.

Proximity sensor assemblies 201 and 211 are each mounted on a planar mounting surface 302 and 312, respectively, of end caps 301 and 311, respectively, as illustrated in FIGS. 2–3. End caps 301 and 311 are positioned at opposite ends of cylinder housing 310 and are connected to one another by crosspieces 320. Proximity sensor assemblies 201 and 211 may be mounted to mounting surfaces 302 and 312, respectively, with any suitable mounting assembly. As one example, as illustrated in FIGS. 2–3, proximity sensor assembly 201 may be mounted to mounting surface 302 with mounting screws or bolts 281–282, and proximity sensor assembly 211 may be mounted to mounting surface 312 with mounting screws or bolts 283–284.

Proximity sensor assemblies 201 and 211 may be mounted such that distance 410 is less than distance 110 for prior art proximity sensor arrangement 100 of FIG. 1. As illustrated in FIG. 3, proximity sensor assembly 201 may be mounted in relation to cylinder housing 310 such that an axis 402 of the electrical connector supported with connector support 202 intersects a center line 410 of the cylinder housing 310 at a fixed angle 405 less than approximately 90 degrees and greater than approximately zero degrees. Proximity sensor assembly 211 may likewise be mounted in relation to cylinder housing 310 such that an axis 412 of the electrical connector supported with connector support 212 intersects a center line 410 of the cylinder housing 310 at a fixed angle 415 less than approximately 90 degrees and greater than approximately zero degrees.

The orientation of the electrical connectors at fixed angles 405 and 415 relative to center line 410 allows for proximity sensor assemblies 201 and 211 to be mounted relatively closer to one another while shielding conductor cables 205 and 215 in a corridor or region between the outer sides from which connector supports 202 and 212 extend, as illustrated in FIGS. 2–3. In this manner, proximity sensor assemblies 201 and 211 may be mounted to a cylinder having an actuator with a relatively shorter path of travel between probe positions 204 and 214 while minimizing the potential for damage to conductor cables 205 and 215.

Proximity sensor assemblies 201 and 211 may be mounted such that axes 402 and 412 intersect center line 410 at any suitable angle 405 and 415, respectively, less than approximately 90 degrees and greater than approximately zero degrees. Proximity sensor assemblies 201 and 211 may be mounted such that angles 405 and 415 are approximately the same, orienting axes 402 and 412 in a parallel fashion. Alternatively, proximity sensor assemblies 201 and 211 may be mounted such that angles 405 and 415 are different.

For some embodiments, proximity sensor assemblies 201 and 211 may be mounted such that fixed angles 405 and 415 are in the range of approximately 10 degrees to approximately 55 degrees. Proximity sensor assemblies 201 and 211 may be mounted such that fixed angles 405 and 415 are in the range of approximately 15 degrees to approximately 30 degrees, for example. For one embodiment, proximity sensor assemblies 201 and 211 may be mounted such that fixed angles 405 and 415 are each approximately 25 degrees.

To help facilitate mounting proximity sensor assemblies 201 and 211 such that fixed angles 405 and 415 are less than approximately 90 degrees and greater than approximately zero degrees, proximity sensor assemblies 201 and 211 may be configured such that axes 402 and 412 intersect tangential lines 403 and 413, respectively, at any suitable angle 404 and 414, respectively, less than approximately 90 degrees, as illustrated in FIG. 3. Proximity sensor assemblies 201 and 211 may be configured such that angles 404 and 414 are approximately the same or, alternatively, are different.

For some embodiments, proximity sensor assemblies 201 and 211 may be configured such that fixed angles 404 and 414 are in the range of approximately 35 degrees to approximately 80 degrees. Proximity sensor assemblies 201 and 211 may be configured such that fixed angles 404 and 414 are in the range of approximately 60 degrees to approximately 75 degrees, for example. For one embodiment, proximity sensor assemblies 201 and 211 may be configured such that fixed angles 404 and 414 are each approximately 65 degrees.

FIGS. 4, 5, 6, 7, and 8 illustrate proximity sensor assembly 201 for one embodiment. Proximity sensor assembly 201 includes a sensor housing 220, an elongated probe 250, a printed circuit board 260 for supporting sensor circuitry, and a cover 270. Proximity sensor assembly 211 of FIGS. 2–3 may be similarly constructed as proximity sensor assembly 201.

Figure 4:
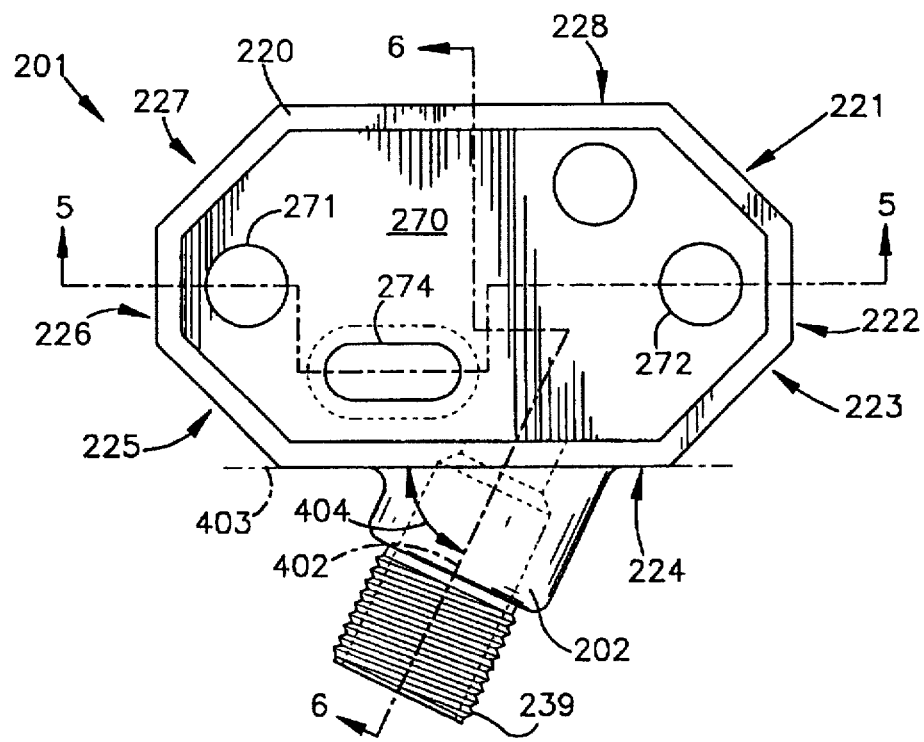
FIG. 4 illustrates a top plan view of a proximity sensor assembly in accordance with the present invention.
Figure 5:
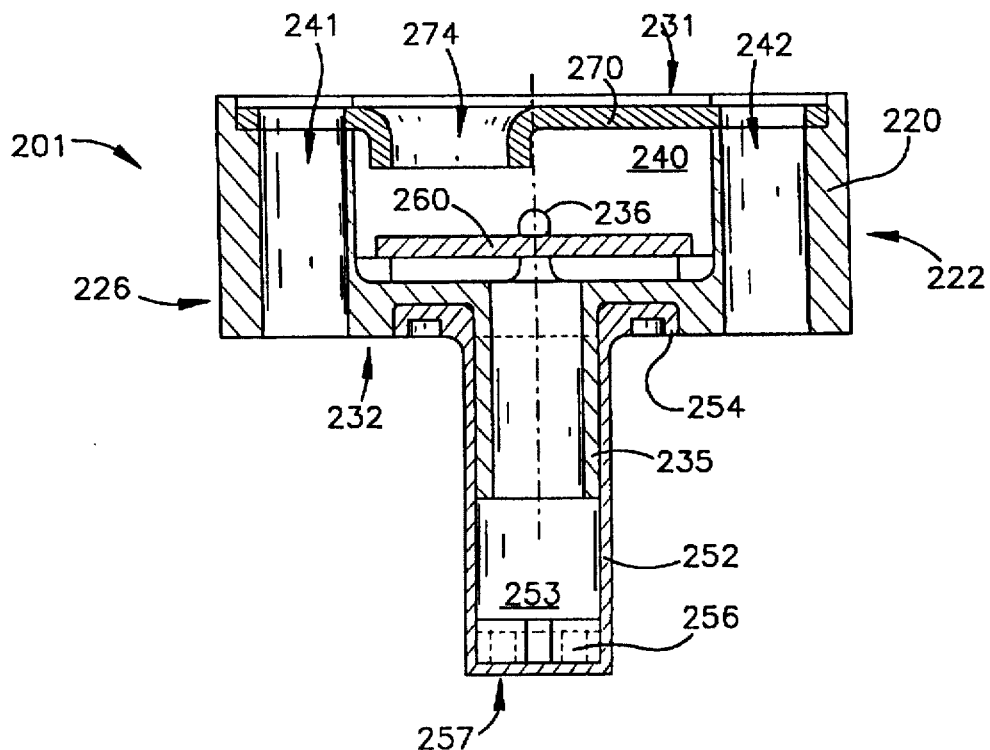
FIG. 5 illustrates a cross-sectional view along line 5—5 of the proximity sensor assembly of FIG. 4.
Figure 7:
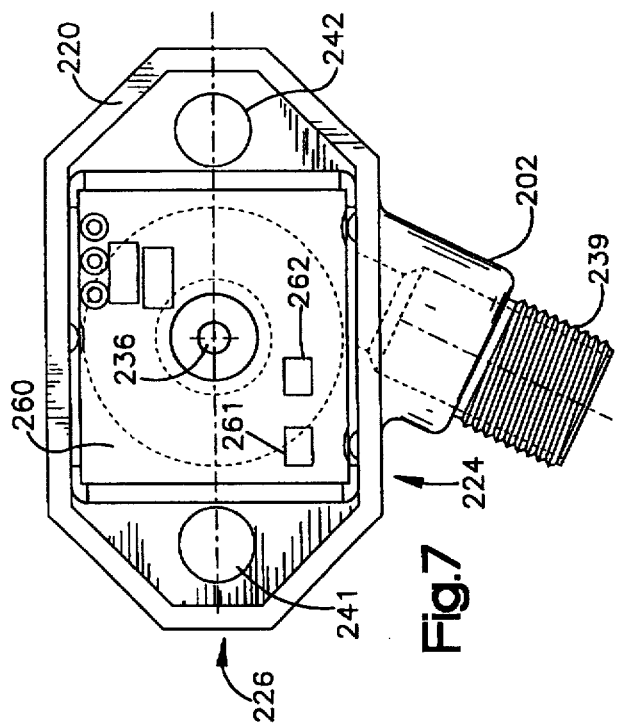
FIG. 7 illustrates a top plan view of the proximity sensor assembly of FIG. 4 with a cover removed from the proximity sensor assembly.
Figure 6:
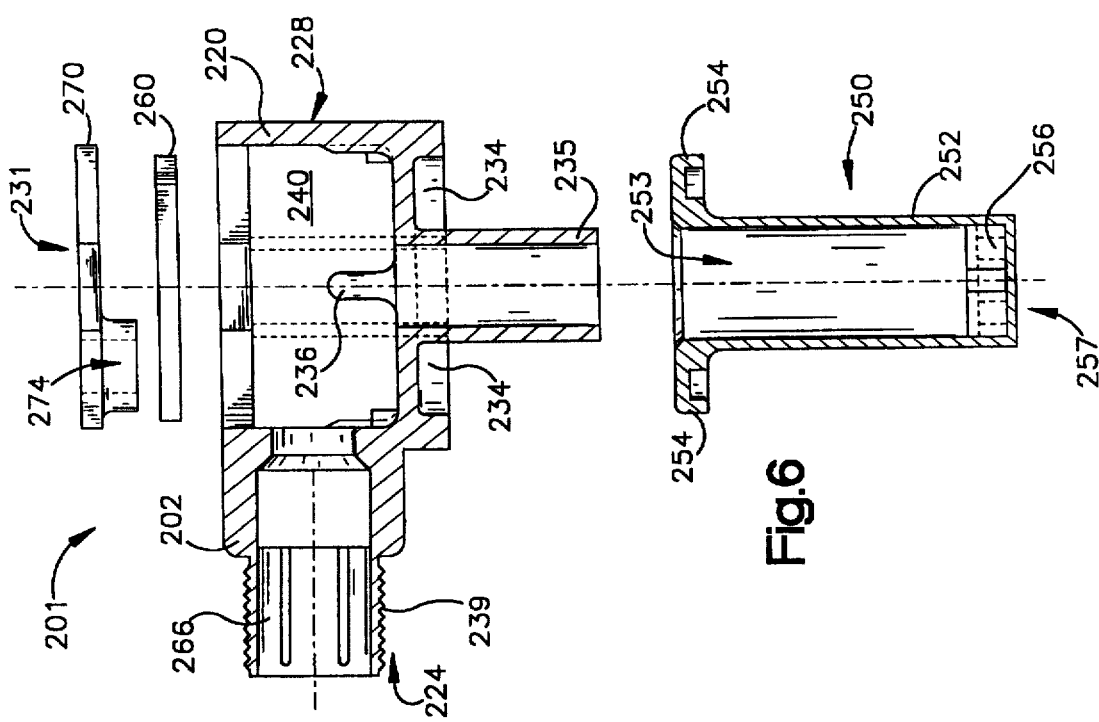
FIG. 6 illustrates an exploded, cross-sectional view along line 6—6 of the proximity sensor assembly of FIG. 4.

As illustrated in FIGS. 5–7, sensor housing 220 is molded to define an interior region 240. Sensor housing 220 has eight sides 221, 222, 223, 224, 225, 226, 227, and 228, a top 231, and a base 232 to define interior region 240, as illustrated in FIGS. 4–7. Sensor housing 220 may be formed from any suitable material. Sensor housing 220 may be a metal die casting, metal investment casting, or a molded plastic, for example, formed to any suitable dimensions. For one embodiment, sensor housing 220 is a zinc die casting and is approximately 1.93 inches in width from side 222 to side 226, approximately 1.12 inches in length from side 224 to side 228, and approximately 0.74 inch in height from top 231 to base 232.

Sensor housing 220 is molded at base 232 with an annular groove 234 that surrounds a cylindrical probe guide 235 extending outward from base 232 for positioning probe 250 at base 232, as illustrated in FIGS. 5–6. Probe guide 235 may have any suitable dimensions and for one embodiment extends approximately 0.50 inch from base 232. Probe 250 includes a cylindrical probe sleeve 252 defining an interior region 253 and having an annular flange 254 surrounding the mouth of probe sleeve 252. Probe 250 is coupled to extend from base 232 of sensor housing 220 by inserting probe guide 235 through the mouth of probe sleeve 252 and into interior region 253 and mating annular flange 254 with annular groove 234 of sensor housing 220, as illustrated in FIG. 5. Probe sleeve 252 may be formed from any suitable material, including plastic for example, and may have any suitable dimensions. Probe sleeve 252 may be secured to sensor housing 220 in any suitable manner, such as with an adhesive for example.

Probe 250 includes a sensing coil 256 positioned in interior region 253 at a closed distal end 257 of probe sleeve 252. For one embodiment, sensing coil 256 is a sensor pot core assembly. When proximity sensor assembly 201 is mounted on mounting surface 302, probe 250 is inserted into an aperture of mounting surface 302 to position probe 250 in a sensing position in cylinder housing 310. As the actuator moves in cylinder housing 310, signals induced in sensing coil 256 indicate the position of the actuator in relation to the sensing coil 256.

Probe 250 is electrically coupled to the sensor circuitry of printed circuit board 260. Based on the signals induced in sensing coil 256, the sensor circuitry senses the position of the actuator in cylinder housing 310. As illustrated in FIG. 7, the sensor circuitry includes status light emitting diodes (LEDs) 261 and 262 to indicate power and target statuses for proximity sensor assembly 201.

Printed circuit board 260 is mounted in interior region 240 by placing printed circuit board 260 through top 231 and positioning printed circuit board 260 with guide 236 in interior region 240, as illustrated in FIGS. 5–7. Guide 236 is formed as a molded portion of sensor housing 220 such that guide 236 is aligned along a central axis of groove 234 and probe guide 235. The sensor circuitry of printed circuit board 260 is electrically coupled to a cylindrical electrical connector 266 placed in and supported with connector support 202, as illustrated in FIG. 6. Any suitable electrical connector model may be used for electrical connector 266, such as a Euro Connector Model, Micro Connector Model, or Mini Connector Model disclosed on pages 63 and 216–221 of the Namco® Electronic Sensors General Catalog 1994 for example.

Connector support 202 is formed as a molded portion of sensor housing 220 and extends outward from side 224, as illustrated in FIGS. 4 and 6–7. For other embodiments, connector support 202 may be separate from sensor housing 220 and coupled in a suitable manner to side 224 of sensor housing 220. As illustrated in FIGS. 3–4, connector support 202 supports electrical connector 266 such that axis 402 of electrical connector 266 intersects tangential line 403 at fixed angle 404. Line 403 is tangential to side 224, as illustrated in FIG. 4. Connector support 202 may extend to any suitable length at any suitable location from side 224 and intersect tangential line 403 at any suitable angle 404. For one embodiment, as illustrated in FIG. 3, connector support 202 extends approximately 0.88 inch from side 224 such that angle 404 is approximately 65 degrees and such that axis 402 intersects a line extending between central points of mounting screws 281 and 282 at a point approximately 0.351 inch from probe position 204.

As illustrated in FIGS. 4–6, cover 270 may be placed over and supported by sensor housing 220 near top 231 to cover printed circuit board 260 in interior region 240. Cover 270 may be formed from any suitable material, including hardened steel for example, and may have any suitable dimensions. Cover 270 includes a viewport 274 positioned for alignment with status LEDs 261 and 262, as illustrated in FIGS. 4–6 and 8, to expose status LEDs 261 and 262 through cover 270 when cover 270 is placed over sensor housing 220. Cover 270 may be secured to sensor housing 220 in any suitable manner, such as with an adhesive and mounting screws 281–282 for example.

Figure 8:
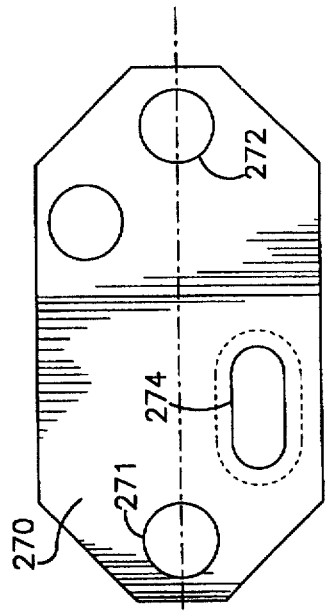
FIG. 8 illustrates a top plan view of the cover of the proximity sensor assembly of FIG. 4.

Proximity sensor assembly 201 may be mounted to mounting surface 302 with mounting screws or bolts 281 and 282, as illustrated in FIGS. 2–3. Mounting screws or bolts 281 and 282 may be inserted through openings 271 and 272, respectively, of cover 270 and through apertures 241 and 242, respectively, molded in sensor housing 220. As illustrated in FIGS. 5 and 7, aperture 241 is molded in sensor housing 220 from top 231 to base 232 near side 226, and aperture 242 is molded in sensor housing 220 from top 231 to base 232 near side 222. Apertures 241 and 242 may be positioned in any suitable location, and for one embodiment have central points approximately 1.38 inches apart from one another. As illustrated in FIGS. 4–5 and 8, openings 271 and 272 of cover 270 are positioned for alignment with apertures 241 and 242, respectively, when cover 270 is placed over sensor housing 220.

Conductor cable 205 may be coupled to proximity sensor assembly 201, as illustrated in FIGS. 2–3, by aligning conductor cable 205 with electrical connector 266 and mounting conductor cable 205 to a threaded portion 239 at the mouth of connector support 202, as illustrated in FIGS. 4 and 6–7. Once connected to conductor cable 205, electrical connector 266 may route electrical power and switching signals between the sensor circuitry of printed circuit board 260 and conductor cable 205. Any suitable conductor cable 205 may be used.

Figure 9:
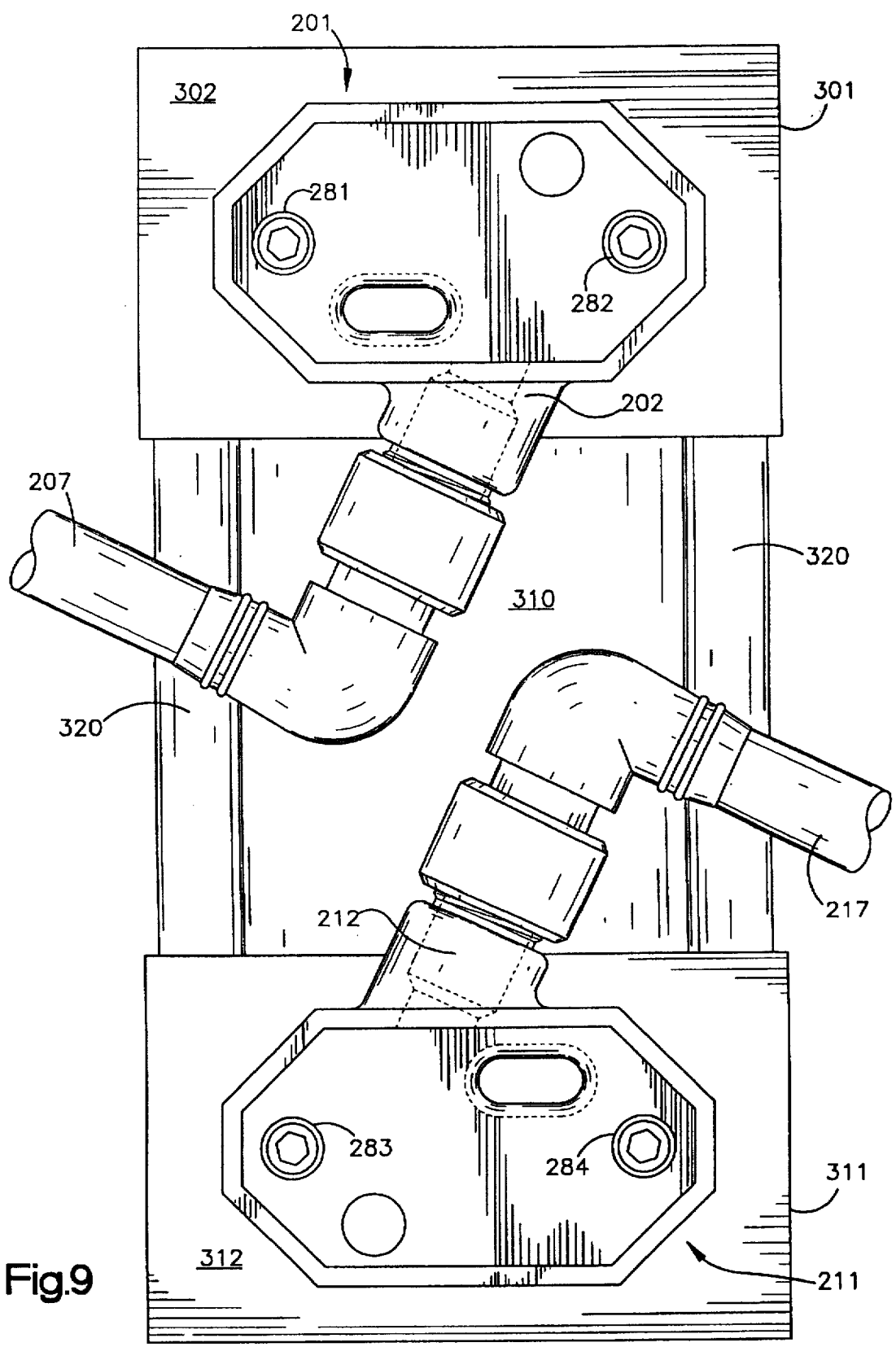
FIG. 9 illustrates a top plan view of another proximity sensor arrangement with right-angle electrical conductor cables.

For other embodiments, a right-angle electrical conductor cable 207 may be used to route electrical signals to and from proximity sensor assembly 201. FIG. 9 illustrates a proximity sensor arrangement having proximity sensor assemblies 201 and 211 mounted on mounting surfaces 302 and 312, respectively, as in FIG. 3 with right-angle electrical conductor cables 207 and 217 mounted to connector supports 202 and 212, respectively.

Suitable conductor cables for use with proximity sensor assemblies 201 and 211 are available from Crouse-Hinds, a division of Cooper Industries, at LaGrange, N.C., from Daniel Woodhead Co., a subsidiary of Brad Harrison, of Northbrook, Ill., or from Lumberg, Inc. of Richmond, Va. for example, and are also disclosed on pages 216–221 of the Namco® Electronic Sensors General Catalog 1994.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. An apparatus comprising:
   a) a first sensor housing defining an interior region and having a base and an outer side, the first sensor housing molded with a connector support that extends from the outer side of the first sensor housing;
   b) a probe extending from the base of the first sensor housing;
   c) sensor circuitry mounted in the interior region of the first sensor housing and coupled to the probe;
   d) a first electrical connector coupled to the sensor circuitry and supported by the molded connector support such that an axis of the first electrical connector intersects at a fixed angle less than approximately 90 degrees a line tangential to the outer side from which the molded connector support extends; and
   e) a mounting assembly for mounting the first sensor housing to an actuator housing such that the probe is positioned in a predetermined location in relation to an actuator in the actuator housing, the mounting assembly for mounting the first sensor housing to the actuator housing such that the axis of the first electrical connector intersects a center line of the actuator housing at a fixed angle less than approximately 90 degrees and greater than approximately zero degrees to permit an axis of a second electrical connector for an opposing second sensor housing mounted to the actuator housing to intersect the center line of the actuator housing at a fixed angle less than approximately 90 degrees and greater than approximately zero degrees.

2. The apparatus of claim 1, wherein the axis of the first electrical connector intersects the tangential line at a fixed angle between approximately 35 degrees and approximately 80 degrees.

3. The apparatus of claim 2, wherein the axis of the first electrical connector intersects the tangential line of the outer side at a fixed angle between approximately 60 degrees and approximately 75 degrees.

4. The apparatus of claim 1, wherein the axis of the first electrical connector intersects the center line of the actuator housing at a fixed angle between approximately 15 degrees and approximately 30 degrees.

5. An apparatus comprising:
   a) a first sensor housing defining an interior region and having a base and an outer side, the first sensor housing having a first electrical connector that extends from the outer side of the first sensor housing such that an axis of the first electrical connector intersects at a fixed angle less than approximately 90 degrees a line tangential to the outer side from which the first electrical connector extends;
   b) a probe extending from the base of the first sensor housing;
   c) sensor circuitry mounted in the interior region of the first sensor housing and coupled to the probe and to the first electrical connector, the sensor circuitry for sensing a position of an actuator in an actuator housing; and
   d) a mounting assembly for mounting the first sensor housing to the actuator housing such that the probe is positioned in a predetermined location in relation to the actuator and such that the axis of the first electrical connector intersects a center line of the actuator housing at a fixed angle less than approximately 90 degrees and greater than approximately zero degrees, the mounting assembly for mounting the first sensor housing to the actuator housing such that the axis of the first electrical connector intersects the center line of the actuator housing at the fixed angle to permit an axis of a second electrical connector for an opposing second sensor housing mounted to the actuator housing to intersect the center line of the actuator housing at a fixed angle less than approximately 90 degrees and greater than approximately zero degrees.

6. The apparatus of claim 5, in combination with the actuator housing.

7. The apparatus of claim 5, wherein the axis of the first electrical connector intersects the center line of the actuator housing at a fixed angle between approximately 10 degrees and approximately 55 degrees.

8. The apparatus of claim 7, wherein the axis of the first electrical connector intersects the center line of the actuator housing at a fixed angle between approximately 15 degrees and approximately 30 degrees.

9. The apparatus of claim 5, wherein the axis of the first electrical connector intersects the tangential line of the outer side at a fixed angle between approximately 35 degrees and approximately 80 degrees.

10. The apparatus of claim 9, wherein the axis of the first electrical connector intersects the tangential line of the outer side at a fixed angle between approximately 60 degrees and approximately 75 degrees.

11. An apparatus comprising:
   a) a first sensor housing defining an interior region and having a base and an outer side, the first sensor housing having a first electrical connector that extends from the outer side of the first sensor housing;
   b) a probe extending from the base of the first sensor housing;
   c) sensor circuitry mounted in the interior region of the first sensor housing and coupled to the probe and to the first electrical connector, the sensor circuitry for sensing a position of an actuator in an actuator housing; and
   d) a mounting assembly for mounting the first sensor housing to the actuator housing such that the probe is positioned in a predetermined location in relation to the actuator and such that an axis of the first electrical connector intersects a center line of the actuator housing at a fixed, non-adjustable angle less than approximately 90 degrees and greater than approximately zero degrees, the mounting assembly for mounting the first sensor housing to the actuator housing such that the axis of the first electrical connector intersects the center line of the actuator housing at the fixed, non-adjustable angle to permit an axis of a second electrical connector for an opposing second sensor housing mounted to the actuator housing to intersect the center line of the actuator housing at a fixed angle less than approximately 90 degrees and greater than approximately zero degrees.

12. The apparatus of claim 11, wherein the axis of the first electrical connector intersects the center line of the actuator housing at a fixed angle between approximately 10 degrees and approximately 55 degrees.

13. The apparatus of claim 11, wherein the axis of the first electrical connector intersects the center line of the actuator housing at a fixed angle between approximately 15 degrees and approximately 30 degrees.

14. An apparatus comprising:
   a) an actuator housing having a moveable actuator;
   b) a first sensor housing defining a first interior region, the first sensor housing having a first probe extending from a base of the first sensor housing and having a first electrical connector that extends from an outer side of the first sensor housing;
   c) first sensor circuitry mounted in the first interior region of the first sensor housing and coupled to the first probe and to the first electrical connector, the first sensor circuitry for sensing a first position of the actuator in the actuator housing;
   d) a first mounting assembly for mounting the first sensor housing to the actuator housing such that the first probe is positioned in a first predetermined location in relation to the actuator;
   e) a second sensor housing defining a second interior region, the second sensor housing having a second probe extending from a base of the second sensor housing and having a second electrical connector that extends from an outer side of the second sensor housing;
   f) second sensor circuitry mounted in the second interior region of the second sensor housing and coupled to the second probe and to the second electrical connector, the second sensor circuitry for sensing a second position of the actuator in the actuator housing; and
   g) a second mounting assembly for mounting the second sensor housing to the actuator housing such that the second probe is positioned in a second predetermined location in relation to the actuator;

the first mounting assembly and the second mounting assembly mounting the first sensor housing and the second sensor housing to the actuator housing, respectively, such that an axis of the first electrical connector and an axis of the second electrical connector both intersect a center line of the actuator housing at a fixed angle less than approximately 90 degrees and greater than approximately zero degrees.

15. The apparatus of claim 14, wherein the axis of the first electrical connector and the axis of the second electrical connector are parallel.

16. The apparatus of claim 14, wherein the first sensor housing is molded with a connector support that extends from the outer side of the first sensor housing and that supports the first electrical connector such that the axis of the first electrical connector intersects at a fixed angle less than approximately 90 degrees a line tangential to the outer side of the first sensor housing from which the molded connector support extends.

17. The apparatus of claim 16, wherein the axis of the first electrical connector intersects the tangential line of the outer side of the first sensor housing at a fixed angle between approximately 60 degrees and approximately 75 degrees.

18. The apparatus of claim 14, wherein the axis of the first electrical connector intersects the center line of the actuator housing at a fixed angle between approximately 10 degrees and approximately 55 degrees.

19. The apparatus of claim 18, wherein the axis of the first electrical connector intersects the center line of the actuator housing at a fixed angle between approximately 15 degrees and approximately 30 degrees.

* * * * *